(12) United States Patent
LeBlanc et al.

(10) Patent No.: US 10,571,506 B2
(45) Date of Patent: Feb. 25, 2020

(54) MULTI-FIBER IDENTIFICATION USING JACKET COLOR

(71) Applicant: Corning Incorporated, Corning, NY (US)

(72) Inventors: Philip Robert LeBlanc, Corning, NY (US); Rajeshkannan Palanisamy, Painted Post, NY (US); Dale Alan Webb, Corning, NY (US)

(73) Assignee: Corning Incotporated, Corning, NY (US)

( * ) Notice: Subject to any disclaimer, the term of this patent is extended or adjusted under 35 U.S.C. 154(b) by 164 days.

(21) Appl. No.: 15/690,374

(22) Filed: Aug. 30, 2017

(65) Prior Publication Data

US 2018/0059162 A1 Mar. 1, 2018

Related U.S. Application Data

(60) Provisional application No. 62/381,200, filed on Aug. 30, 2016.

(51) Int. Cl.

| | | |
|---|---|---|
| *G01R 31/02* | (2006.01) | |
| *G02B 6/44* | (2006.01) | |
| *G02B 6/255* | (2006.01) | |
| *G06K 9/46* | (2006.01) | |
| *H01B 7/36* | (2006.01) | |

(52) U.S. Cl.
CPC .......... *G01R 31/023* (2013.01); *G02B 6/255* (2013.01); *G02B 6/4482* (2013.01); *G06K 9/4652* (2013.01); *G06T 2207/10024* (2013.01); *H01B 7/361* (2013.01)

(58) Field of Classification Search
CPC .................................................. G01R 31/023
See application file for complete search history.

(56) References Cited

U.S. PATENT DOCUMENTS

| | | | |
|---|---|---|---|
| 3,573,476 A | 4/1971 | Falcoff et al. | |
| 4,731,663 A | * 3/1988 | Kovalchick | G01J 3/46 |
| | | | 382/165 |
| 5,074,643 A | 12/1991 | Petisce | |
| 5,745,628 A | 4/1998 | Benzel et al. | |
| (Continued) | | | |

FOREIGN PATENT DOCUMENTS

| | | |
|---|---|---|
| CN | 204177552 U | 2/2015 |
| JP | 09105702 A | 4/1997 |
| JP | 2010286735 A | 12/2010 |

OTHER PUBLICATIONS

International Search Report and Written Opinion PCT/US2017/048587 dated Nov. 8, 2017.

*Primary Examiner* — Clayton E. LaBalle
*Assistant Examiner* — Jas A Sanghera
(74) *Attorney, Agent, or Firm* — Smit N. Kapadia; Svetlana Z. Short

(57) ABSTRACT

A machine vision system for identifying optical fibers is provided that includes a support plate supporting one or more optical fibers. The one or more optical fibers each include a jacket. A light source is configured to emit light onto the one or more optical fibers. An imager is positioned above the light source. The imager is configured to receive reflected light from the light emitted onto the one or more optical fibers. A display system is configured to receive a signal from the imager and display an augmented image.

19 Claims, 3 Drawing Sheets

(56) References Cited

U.S. PATENT DOCUMENTS

| | | | |
|---|---|---|---|
| 6,650,022 B1* | 11/2003 | Qi | H01L 22/24 257/782 |
| 6,844,931 B2 | 1/2005 | Ehbets | |
| 7,269,318 B2 | 9/2007 | Cook | |
| 7,502,112 B2 | 3/2009 | Kahn et al. | |
| 8,676,021 B2 | 3/2014 | Heidler et al. | |
| 2002/0071277 A1* | 6/2002 | Starner | G06F 3/017 362/276 |
| 2002/0101200 A1 | 8/2002 | Dowling et al. | |
| 2004/0037521 A1 | 2/2004 | Xiong et al. | |
| 2006/0280413 A1* | 12/2006 | Paschal | G02B 6/443 385/112 |
| 2013/0205835 A1 | 8/2013 | Giaretta et al. | |
| 2014/0022535 A1 | 1/2014 | Yamamoto | |

\* cited by examiner

MULTI-FIBER IDENTIFICATION USING JACKET COLOR

This application claims the benefit of priority under 35 U.S.C. § 119 of U.S. Provisional Application Ser. No. 62/381,200 filed on Aug. 30, 2016, the content of which is relied upon and incorporated herein by reference in its entirety as if fully set forth below.

FIELD OF THE DISCLOSURE

The present disclosure generally relates to a system for identifying optical fibers, and more specifically, to a system for identifying optical fibers based on jacket color.

BACKGROUND

Optical fibers are almost exclusively jacketed with one of twelve colors during the cabling process where multiple optical fibers are bundled together. These colors provide easy identification for splicing or other processing of the fibers, but the limited color palette may lead to inefficiencies. Foremost among these is that cable diameters must grow rapidly as fibers are bundled in (relatively coarse) powers of twelve. Most of the cable size is determined by the hard plastic jackets and the support rods with the fibers themselves contributing far less than half the volume. Increasing the number of fibers per cable would result in a significant cost saving.

Unfortunately, splicing of the fibers is a mostly human task and the human ability to discern (to a high confidence) multiple colors in a bundle is limited. Zero errors are tolerated and color confusion grows geometrically with the number of colors over twelve. Traditional portable colorimeters can be used to track coating process accuracy on fiber reels, but these do not have the spatial resolution to track individual fibers.

SUMMARY OF THE DISCLOSURE

According to at least one aspect of the present disclosure, a machine vision system for identifying optical fibers is provided that includes a support plate supporting one or more optical fibers. The one or more optical fibers each include a jacket. A light source is configured to emit light onto the one or more optical fibers. An imager is positioned above the light source. The imager is configured to receive reflected light from the light emitted onto the one or more optical fibers. A display system is configured to receive a signal from the imager and display an augmented image.

According to another aspect of the present disclosure, a machine vision system for identifying optical fibers is provided that includes a support plate, a first contrast enhancing plate and a second contrast enhancing plate positioned on the support plate and a plurality of optical fibers positioned across the first and second contrast enhancing plates. Each of the optical fibers includes a colored jacket. A coaxial illuminator is positioned proximate the optical fibers. The coaxial illuminator includes a light source configured to emit light and a partially reflective, partially transmissive mirror configured to direct the light from the light source onto the plurality of optical fibers. An imager is positioned above the mirror and configured to receive reflected light from the light directed onto the plurality of optical fibers from the light source. A display is configured to display an augmented image of the optical fibers received from the imager based at least in part on the reflected light.

According to another aspect of the present disclosure, a method of identifying optical fibers is provided that includes the steps of positioning a plurality of optical fibers within a machine vision system, each of the optical fibers comprising a different colored jacket; positioning a calibration target within the machine vision system; illuminating the plurality of optical fibers and the calibration target with a light; acquiring an image of the optical fibers and the calibration target after the illuminating step; comparing the calibration target and the optical fibers within the image; and classifying the plurality of optical fibers based on the different colored jackets of the optical fibers in the image.

These and other features, advantages, and objects of the present disclosure will be further understood and appreciated by those skilled in the art by reference to the following specification, claims, and appended drawings.

DETAILED DESCRIPTION

Additional features and advantages of the invention will be set forth in the detailed description which follows and will be apparent to those skilled in the art from the description, or recognized by practicing the invention as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Figure 1:
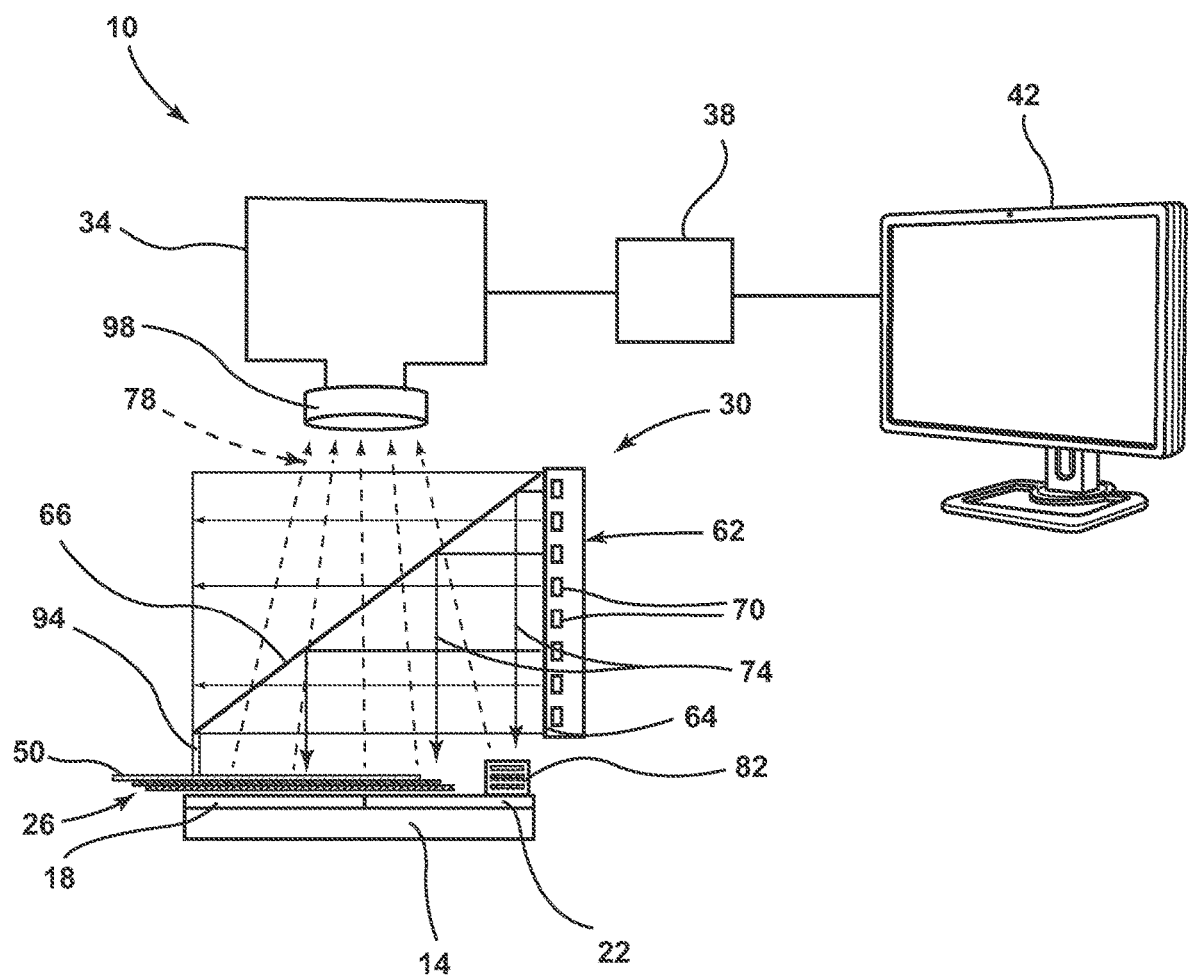
FIG. 1 depicts a schematic machine vision system, according to one embodiment.
Figure 2:
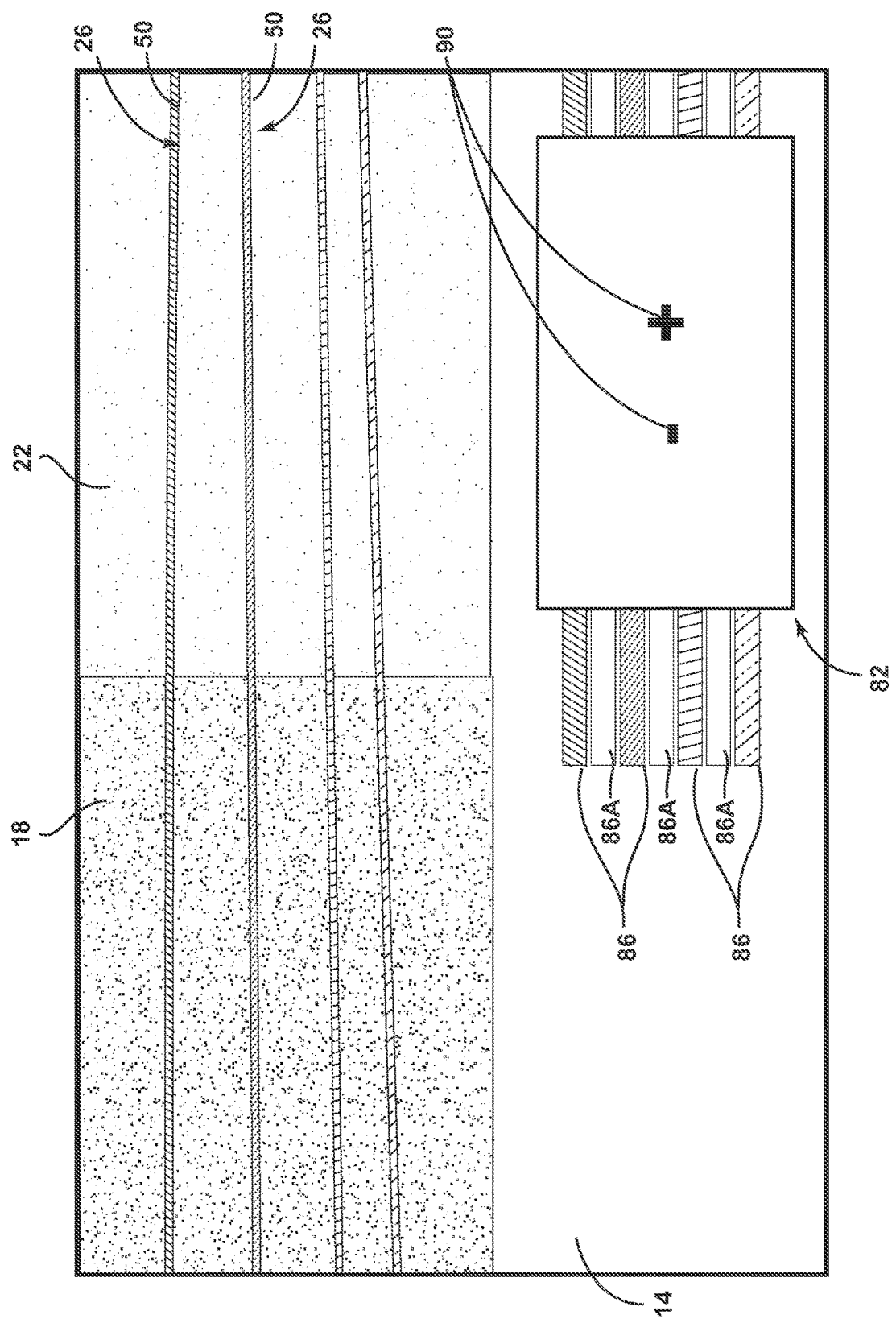
FIG. 2 depicts a view from an imager of the machine vision system of FIG. 1, according to one embodiment.

Referring to FIGS. 1 and 2, reference numeral 10 generally designates a machine vision system. The system 10 includes a support plate 14 generally positioned at a bottom of the system 10. Positioned on the support plate 14 is a first contrast enhancing plate 18 and a second contrast enhancing plate 22. One or more optical fibers 26 are positioned on and over the first and second contrast enhancing plates 18, 22. A coaxial illuminator 30 is positioned proximate the support plate 14 and the optical fibers 26. It will be understood that another light source may be used instead of the coaxial illuminator 30 as explained in greater detail below. An imager 34 is positioned above the coaxial illuminator 30. The imager 34 is configured to acquire an image of the optical fibers 26 and the first and second contrast enhancing plates 18, 22. Electrically connected to the imager 34 is a processor 38 and a display 42. The processor 38 is configured to alter the acquired image from the imager 34 into an augmented image identifying each of the optical fibers 26, and the display 42 is configured to display the augmented image for a user of the machine vision system 10.

The optical fibers 26 may include a glass core surrounded by a glass cladding. The glass core and the glass cladding may be configured to allow the transmission of light signals from one end of each of the optical fibers 26 to another. Positioned around the glass cladding of each of the optical fibers 26 is a fiber jacket 50. The fiber jacket 50 may be a coating or cover configured to prevent damage to the optical fibers 26 due to environmental exposure, handling, splicing and other application-related conditions. The fiber jackets 50 may include a polymeric material, a metal, a paint or combinations thereof.

According to various embodiments, the fiber jackets 50 may be colored to indicate the signal carried by the optical fibers 26 such that each of the optical fibers 26 may be individually identified by the color of the jacket 50. Each of the optical fibers 26 may have a different colored jacket 50. The optical fibers 26 may be part of a plurality of fibers 26 bundled to form a telecommunications cable (e.g., as spanning from building to building, or utility to building, as an undersea cable, etc.). In splicing sections of the telecommunications cable together, the plurality of optical fibers 26 within the cable may be broken out and placed in the system 10 and onto the first and second contrast enhancing plates 18, 22 to help identify each of the optical fibers 26. Further, the system 10 may also be used to help identify the optical fibers 26 when being connected to electro-optic equipment.

The first and second contrast enhancing plates 18, 22 are configured to increase the contrast of the optical fibers 26 as imaged by the imager 34. The first and second contrast enhancing plates 18, 22 may be substrates or other colored media and are not limited to plates. It will be understood that more or less than two contrast enhancing plates may be used by the system 10. According to various embodiments, the optical fibers 26 may be suspended above the first and second contrast enhancing plates 18, 22 such that the first and second contrast enhancing plates 18, 22 are out of focus to the imager 34. The first and second contrast enhancing plates 18, 22 may be a dark or light color, relative to the colored jackets 50 of the optical fibers 26. In specific examples, the first and/or second contrast enhancing plates 18, 22 may be black or blue. Further, the first and second contrast enhancing plates 18, 22 may be a solid color, or may define one or more patterns. The first and second contrast enhancing plates 18, 22 may be different colors than one another and/or may define different patterns than one another. The optical fibers 26 are positioned on, and extend across, both the first and second contrast enhancing plates 18, 22. In embodiments where the first and second contrast enhancing plates 18, 22 are different colors, the different colors may help to distinguish optical fibers 26 which have a jacket color 50 which is similar to the contrast enhancing plates 18, 22. For example, where the first contrast enhancing plate 18 is black, and the second contrast enhancing plate 22 is blue, the second contrast enhancing plate 22 will enhance the contrast of black jacket 50 optical fibers 26 which may not otherwise be readily visible on the black example of the first contrast enhancing plate 18.

Positioned above the optical fibers 26 and the contrast enhancing plates 18, 22, and between the support plate 14 and the imager 34, is the coaxial illuminator 30. It will be understood that the coaxial illuminator 30 may be placed in a variety of locations around the system 10. The coaxial illuminator 30 includes a lighting unit 62, a diffuser 64 and a mirror element 66. The lighting unit 62 includes a plurality of light sources 70 configured to provide emitted light 74. The emitted light 74 is then passed through the diffuser 64. The coaxial illuminator 30 provides a diffuse light source onto the optical fibers 26 such that the production of shadows and illumination variances is reduced. The light sources 70 may include light emitting diodes (LEDs), incandescent bulbs, or other structures configured to emit light. The light sources 70 may change the color of the emitted light 74 between white and non-white light (e.g., yellow, magenta, ultraviolet, near-infrared, etc.) and/or the intensity of the emitted light 74. Further, the polarization of the emitted light 74 may be altered. Even further, the emitted light 74 may be configured to cause at least one of the jackets 50 to fluoresce. The alteration of the color and/or intensity of the emitted light 74 may be performed by activating more or less of the light sources 70 (e.g., activate a red LED, a blue LED, a green LED, or combinations thereof to create different white and non-white emitted light 74). Further, a filter wheel may be utilized to control the color and/or intensity of the emitted light 74 and may be positioned proximate the diffuser 64. It will be understood that another light source (e.g., a lamp, incandescent bulb, etc.) may replace the coaxial illuminator without departing from the teachings provided herein. Changing the intensity of the emitted light 74 may be altered by varying the duty cycle of LEDs, increasing a voltage/current of the light sources 70, or activing more light sources 70. The emitted light 74 exits the lighting unit 62 and diffuser 64 and contacts the mirror element 66. The mirror element 66 is configured to both reflect and transmit light falling on the mirror element 66. According to various embodiments, the mirror element 66 may be configured to transmit about 50% and reflect about 50% of the emitted light 74. In other embodiments, the mirror element 66 may have a transmissivity of about 10%, 20%, 30%, 40%, 60%, 70%, 80%, or 90%. In other embodiments, the mirror element 66 may have a reflectivity of about 10%, 20%, 30%, 40%, 60%, 70%, 80%, or 90%. The portion of the emitted light 74 that is reflected from the mirror element 66 is reflected downward onto the optical fibers 26 and a calibration target 82. The portion of the emitted light 74 that is transmitted may be transmitted though the mirror element 66. The portion of the emitted light 74, which impinges on the optical fibers 26 and the calibration target 82, is reflected back upward to the mirror element 66 as reflected light 78 and transmitted through the element 66 to the imager 34.

As shown in FIG. 2, the calibration target 82 is a referenced sample comprising a plurality of color samples 86. In the depicted embodiment, the color samples 86 are a plurality of reference fibers (e.g., small samples of the optical fibers 26 being identified), but may also be color swatches or other colored items. The color samples 86 are substantially similar in color to the colors of the fiber jackets 50. According to various embodiments, the color samples 86 may be arranged in a predetermined order. In the depicted embodiment, each of the reference fibers of the color samples 86 are separated by white colored fibers 86A. Separation of the color samples 86 may allow each of the individual color samples 86 to be identified as described in greater detail below. The calibration target 82 creates a self-reference in each image acquired by the imager 34, to which the colors of the fiber jackets 50 of the optical fibers 26 may be compared. This means that changes in the environment of the system 10, such as going from an fiber processing facility to the outdoor fiber splicing setup, does not create major changes in color assignments (i.e., because both the calibration target 82 and the optical fibers 26 undergo the same lighting changes). Use of the calibration target 82 also makes the identification of the fibers 26 robust to aging of the light sources 70, changes in the focus of the imager 34, changes in the aperture size of the imager 34, shadows or reflections from the operator, etc. The calibration target 82 may also include a location reference 90 (FIG. 2). The location reference 90 is an image, object or text which can be used for determining the location of the calibration target 82 and the color samples 86 within the image, as explained in greater detail below.

According to various embodiments, one or more clamps 94 (FIG. 1) may be positioned on the system 10 to clamp the optical fibers 26 to the first and second contrast enhancing plates 18, 22. According to one example, the clamps 94 may be a spring loaded clip. The clamps 94 serve to hold the optical fibers 26 in place and/or to prevent the optical fibers 26 from drifting in and out of focus.

The imager 34 is configured to capture an image of the optical fibers 26, the first and second contrast enhancing plates 18, 22 and the calibration target 82. The imager 34 may include one or more high resolution sensors, such as a two megapixel sensor. Further, the imager 34 may feature a Bayer color filter to provide color contrast, or it may comprise a three charge-coupled device (CCD) which features a red-green-blue filter set. The imager 34 may include one or more cameras, each having a static color filter or a color-changing filter such as a filter wheel. Using a high resolution camera provides accurate color and high spatial resolution in a high speed, single acquisition of an image. Use of a high numerical aperture lens 98, according to some implementations, may provide high resolving power for the small size of the optical fibers 26 and collect the reflected light 78 over large angles. The acquired image of the optical fibers 26 from the imager 34 should have sufficiently resolved pixels to accurately measure the color of the fiber jackets 50. This condition is met by having a high spatial resolution sufficient to sample the optical fibers 26 into several pixels and by having an optical resolving power sufficient to generate distinct contrast for each pixel. The imager 34 transmits the captured image to the processor 38 which processes the image, as explained in greater detail below, to create the augmented image which is output on the display 42.

The processor 38 is configured to receive an image signal from the imager 34. The processor 38 may include a memory having computer readable instructions used for processing the image signal received from the imager 34. The processor 38 may be configured to alter the image signal received from the imager 34 into an augmented image as explained in greater detail below. The augmented image, as defined herein, is image acquired by the imager 34 including a graphic overlay identifying each of optical fibers 26 by color. It will be understood that the graphic overlay of the augmented image may include more or less (e.g., only some optical fibers 26) information than just the fiber color. The augmented image is then transferred by the processor 38 to the display 42, which displays the augmented image. It will be understood that the augmented image may be a single (e.g., still) image, or may be a live video feed (e.g., from the imager 34) in which the graphic overlay has been added.

Further, the augmented image may be replaced by or used in conjunction with, another form of indicator (e.g., a sound, a light, a print out) which may identify the optical fibers 26.

Figure 3:
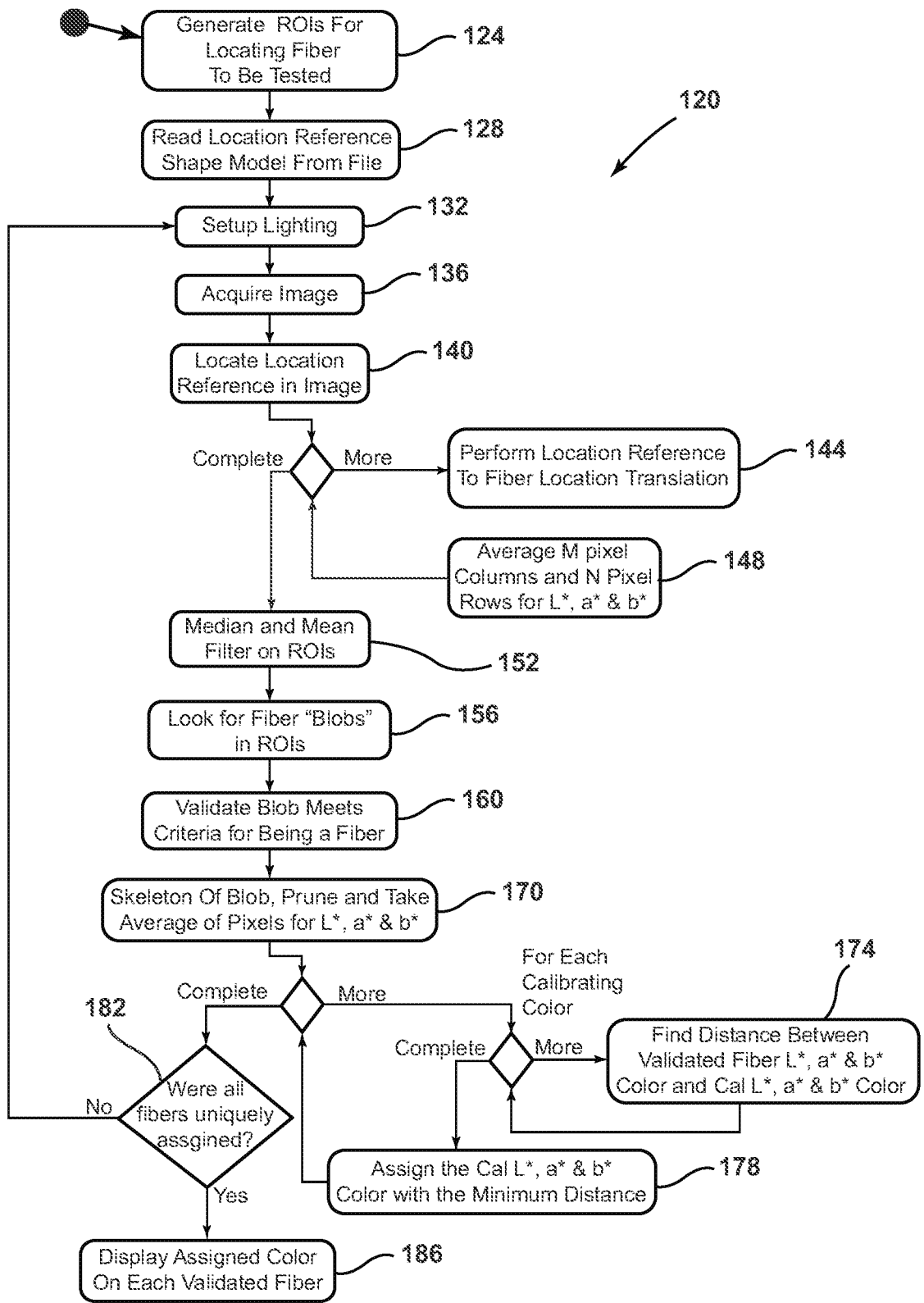
FIG. 3 depicts an algorithm for identifying an optical fiber, according to one embodiment.

Referring now to FIG. 3, depicted is an exemplary algorithm 120 performed by the processor 38 (FIG. 1) for identifying the optical fibers 26. The algorithm 120 begins with step 124 of generating region-of-interests (ROI) for locating an optical fiber to be tested. The ROIs may correspond to the first and second contrast enhancing plates 18, 22, or sections of the optical fibers 26 which extend between the first and second contrast enhancing plates 18, 22. It will be understood that a ROI may be created for each contrast enhancing plate in embodiments utilizing more or less than two. In a specific embodiment, the ROIs may be taken proximate an interface between the first and second contrast enhancing plates 18, 22 and proximate the optical fibers 26.

Next, step 128 of reading a shape model of the location reference 90 of the calibration target 82 from a file is performed. In step 128, the shape of the location reference 90 is read from a stored file on the processor 38, or an associated memory. By reading the shape of the location reference 90 in from a file, the processor 38 (FIG. 1) will know what shape to look for to identify the calibration target 82 within an image. Further, by identifying the location reference 90, the processor 38 may know where to look for the color samples 86.

Next, step 132 of setting up lighting is performed. In step 132, the coaxial illuminator 30 (FIG. 1) is activated to shine the emitted light 74 onto the optical fibers 26. The color and/or intensity of the emitted light 74 may be predetermined or set by a user of the system 10 (FIG. 1). Step 132 may be revisited during the algorithm 120 to adjust the color, intensity and/or polarization of the emitted light 74 as explained in greater detail below.

Next, step 136 of acquiring an image is performed. The image is acquired using the imager 34 (FIG. 1). The image is transmitted to the processor 38 for processing. A single image may be acquired, or a live video feed may be supplied to the processor 38.

Next, step 140 of locating the location reference 90 in the image is performed. The stored location reference 90 of step 128 is compared to the image such that the processor 38 may locate the location of the location reference 90 in the image.

Next, step 144 of performing a location reference 90-to-fiber location translation is performed. In step 144, the location reference 90 is used to determine the location of the color samples 86 in the image. For example, the location reference 90 shape model, read in step 128, may provide the translational distance (e.g., in the number of pixels) from the location reference 90 to the color samples 86 such that the processor 38 may locate the color samples 86 in the image.

Next, step 148 of averaging M pixel columns and N pixel rows for L*a*b* is performed. It will be understood that the M and N represent integer variables. In step 148, the L*a*b* color coordinates are determined for each of the color samples 86 for later comparison to the optical fibers 26. A L*a*b* color space is a color-opponent space with dimension L* for lightness and a* and b* for the color-opponent dimensions, based on nonlinearly compressed coordinates. The L*a*b* color space may be based on the 1976 CIELAB color space as known in the art. The color coordinates for each of the color samples 86 are determined and saved. It will be understood that color spaces other than L*a*b* may be used without departing from the teachings provided herein. A predetermined order of the color samples 86 may be known and used in step 144 and/or step 148 to aid in the identification of each color sample 86. Steps 144 and 148 may be repeated as necessary to identify color coordinates for each color sample 86.

Next step 152 of determining the median and mean filter on the regions of interest is performed. Step 152 is a processing of the image to remove artifacts (e.g., from dust, lighting contaminants within the system 10, etc.) from the image which may interfere with the recognition of the optical fibers 26. Further, step 152 may provide a straightening of the optical fibers 26.

Next, step 156 of looking for fiber binarized linear objects ("blobs") in the ROIs is performed. In step 156, the processor 38 looks for blobs of color in the acquired image that may correspond to the optical fibers 26. The blobs may be determined by global thresholds, histogram based auto-thresholding, and/or other local thresholding techniques. Step 156 is performed by searching for pixels that are thresholded (sharply visible or sharply contrasted) from the background (e.g., the first and second contrast enhancing plates 18, 22). The pixels may be determined to be thresholded from the background if there is a certain color or intensity difference between a grouping of pixels and the background (i.e., indicating the presence of an optical fiber 26).

Next, step 160 of validating that the blobs meet the criteria for being an optical fiber 26. In other words, step 160 validates that an identified blob is in fact an optical fiber 26. The blob may be validated based on predetermined fiber-related criteria, such as minimum or maximum length, minimum or maximum width, minimum or maximum area, or minimum or maximum angle of the optical fibers 26. By comparing the identified blobs to predetermined fiber criteria, the processor 38 may distinguish between non-fibers (e.g., dust, contaminants or other debris within the system 10) and the optical fibers 26.

Next, step 170 of taking the "skeleton" of the blob, pruning and taking an average of the pixels of L*a*b* is performed. Taking the skeleton of step 170 and pruning removes edges of the blobs which may cause a distortion in the perceived color of the optical fibers 26. Once the edges of the optical fibers 26 have been pruned, an average of the pixels of the blob is used to calculate L*a*b* color coordinates. Step 170 is performed for each validated optical fiber 26.

Next, step 174 of finding a distance between validated L*a*b* colors and the L*a*b* color of the color samples 86 is performed. The distance calculation determines how different the sensed color coordinates of the validated optical fiber 26 and the color samples 86 are from one another. Step 174 is compared to the sensed L*a*b* values for the optical fiber 26 against each color sample 86.

Next, step 178 of assigning the color with the minimum distance between the color sample 86 and the sensed values of the optical fiber 26 is performed. The minimum distance may be a predefined minimum or an industry standard for comparison of colors. If the distance between the color coordinate of the validated optical fiber 26 and the color sample 86 is below a predetermined minimum value (i.e., indicating the color sample 86 and the validated optical fiber 26 are similar), the color of the color sample 86 is assigned to the validated optical fiber 26. Steps 174 and 178 are then performed for each validated optical fiber 26.

Next, step 182 is performed which determines if all of the validated optical fibers 26 had a unique order assignment from steps 174 and 178. Under certain circumstances, each optical fiber 26 may not be assigned a unique identifier because the current lighting conditions implemented in step 132 causes two or more of the optical fibers 26 to not be registered or have a highly similar color. If each of the optical fibers 26 has a unique identifier, the algorithm proceeds to step 186. If not all of the optical fibers 26 are assigned a unique identifying color, are unassigned, or multiple optical fibers are assigned the same identifier, the algorithm 120 returns to step 132 of setting up the lighting. If the algorithm 120 has been returned to step 132, the lighting is altered (e.g., intensity, polarization and/or color is adjusted) to illuminate the fibers 26 differently and the algorithm 120 re-runs until each fiber 26 has been assigned a unique identifier.

Once the color is determined for each of optical fibers 26, step 186 of displaying the assigned colors on each of the validated fibers is performed. The assigned colors are displayed on the optical fibers 26 in the augmented image which is displayed on the display 42 (FIG. 1).

According to one exemplary use of the algorithm 120, a method of identifying optical fibers 26 may include the steps of positioning a plurality of optical fibers 26 within the machine vision system 10. Each of the optical fibers 26 includes a different colored jacket 50. Next, a step of positioning the calibration target 82 within the machine vision system 10 may be performed. Next, a step (e.g., step 132) of illuminating the plurality of optical fibers 26 and the calibration target 82 with a light (e.g., the coaxial illuminator 30) is performed. Next, a step (e.g., step 136) of acquiring an image (e.g., using the imager 34) of the optical fibers 26 and the calibration target 82 after the illuminating step is performed. Next, a step (e.g., 174) of comparing the calibration target 82 and the optical fibers 26 within the image is performed. Next, a step (e.g., step 178) of classifying the plurality of optical fibers 26 based on the different colored jackets 50 of the optical fibers 26 in the image is performed. Once the optical fibers 26 have been classified, a step (e.g., step 182) of displaying an augmented image of the plurality of fibers 26 to identify the fibers 26 after the classifying step is performed. If not all of the optical fibers 26 are classified within a predetermined level of confidence, a step (e.g., step 182 and step 132) of adjusting at least one of an intensity and a color of the light during the step of illuminating the plurality of optical fibers 26 and the calibration target 82 step is performed. After the lighting has been adjusted, a step (e.g., 136) of acquiring a second image of the optical fibers 26 and the calibration target 82 after the adjusting step is performed.

Use of the present disclosure may offer a variety of advantages. First, use of the system 10 allows for the identification of sixty-four or more fibers. This is three times more than what can be done reliably by a human eye and four times what has been automated. Second, the design of the system 10 is compact, portable and inexpensive allowing for the easy identification of fibers in the field. Third, the measurement of the optical fibers 26 is robust and insensitive to environmental and system changes (e.g., ambient lighting, time of day, aging of light sources 70, exposure time, etc.) due to the calibration target 82. As the calibration target 82 undergoes the same changes in lighting as the optical fibers 26, the system 10 may be used under a variety of light and field conditions. Fourth, identification of the optical fibers 26 may be very quick, allowing for the quick identification of the optical fibers 26. Fifth, system 10 can be easily integrated into a Virtual Reality or Augmented Reality environment where the fiber identification results could be overlaid in real-time with a live video of a splice bench. Sixth, the system 10 has high spatial resolution which allows for the individual identification of the optical fibers 26.

Seventh, the above-disclosed identification techniques may be used for both splicing optical fibers 26 together (e.g., to form a cable between buildings or land masses), for attaching connectors to the optical fibers 26, and/or for connecting the optical fibers 26 to electro-optic equipment. Further, the system 10 may be utilized to identify individual cables of a larger transmission cable. Eighth, the system 10 may be utilized for inspection of the optical fibers 26 (e.g., examine for damage).

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures, and/or members, or connectors, or other elements of the system, may be varied, and the nature or numeral of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes, or steps within described processes, may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and, further, it is to be understood that such concepts are intended to be covered by the following claims, unless these claims, by their language, expressly state otherwise. Further, the claims, as set forth below, are incorporated into and constitute part of this Detailed Description.

What is claimed is:

1. A machine vision system for identifying optical fibers, comprising:
    a support plate supporting one or more optical fibers, the one or more optical fibers each comprising a jacket;
    a first contrast enhancing plate positioned between the support plate and the one or more optical fibers;
    a second contrast enhancing plate positioned between the support plate and the one or more optical fibers;
    a light source configured to emit light onto the one or more optical fibers;
    an imager positioned above the light source, the imager configured to receive reflected light from the light emitted onto the one or more optical fibers; and
    a display system configured to receive a signal from the imager and display an augmented image.

2. The machine vision system of claim 1, wherein the first and second contrast enhancing plates are different colors.

3. The machine vision system of claim 1, wherein the one or more optical fibers is a plurality of optical fibers, each of the jackets of the optical fibers being a different color.

4. The machine vision system of claim 1, wherein the light source is configured to alter at least one of color and intensity of the light.

5. The machine vision system of claim 1, wherein the augmented image indicates the color of the jacket of each of the one or more optical fibers.

6. A machine vision system for identifying optical fibers, comprising:
    a support plate;
    a first contrast enhancing plate and a second contrast enhancing plate positioned on the support plate;
    a plurality of optical fibers positioned across the first and second contrast enhancing plates, each of the optical fibers comprising a colored jacket;
    a coaxial illuminator positioned proximate the optical fibers, the coaxial illuminator comprising:
        a light source configured to emit light; and
        a partially reflective, partially transmissive mirror configured to direct the light from the light source onto the plurality of optical fibers;
    an imager positioned above the mirror configured to receive reflected light from the light directed onto the plurality of optical fibers from the light source; and
    a display configured to display an augmented image of the optical fibers received from the imager based at least in part on the reflected light.

7. The machine vision system of claim 6, wherein the coaxial illuminator is positioned between the imager and the plurality of optical fibers.

8. The machine vision system of claim 6, wherein the first and second contrast enhancing plates are different colors.

9. The machine vision system of claim 6, wherein the coaxial illuminator is configured to alter at least one of color and intensity of the light.

10. The machine vision system of claim 6, wherein each of the jackets of the optical fibers is a different color.

11. The machine vision system of claim 10, wherein the augmented image indicates the color of each of the jackets of the optical fibers.

12. The machine vision system of claim 6, further comprising:
a calibration target positioned proximate the plurality of optical fibers, the calibration target comprising a plurality of color samples.

13. A method of identifying optical fibers, comprising the steps of:
positioning a plurality of optical fibers within a machine vision system, each of the optical fibers comprising a different colored jacket;
positioning a calibration target within the machine vision system;
illuminating the plurality of optical fibers and the calibration target with a light;
acquiring an image of the optical fibers and the calibration target after the illuminating step;
comparing the calibration target and the optical fibers within the image; and
classifying the plurality of optical fibers based on the different colored jackets of the optical fibers in the image.

14. The method of claim 13, further comprising the step:
displaying an augmented image of the plurality of fibers to identify the fibers after the classifying step.

15. The method of claim 13, wherein illuminating the plurality of optical fibers is performed with a non-white light.

16. The method of claim 13, wherein the plurality of optical fibers comprises 24 or more optical fibers.

17. The method of claim 13, wherein the calibration target comprises a plurality color samples substantially similar to that of the colored jackets.

18. The method of claim 13, wherein the calibration target comprises a plurality of color samples, further wherein the step of comparing the image of the calibration target and the optical fibers comprises comparing a color coordinate of each of the color samples with a color coordinate of each of the different colored jackets.

19. The method of claim 13, further comprising the steps of:
adjusting an intensity or color of the light during the illuminating of the plurality of optical fibers and the calibration target; and
acquiring a second image of the optical fibers and the calibration target after the adjusting step.

* * * * *

UNITED STATES PATENT AND TRADEMARK OFFICE
CERTIFICATE OF CORRECTION

PATENT NO. : 10,571,506 B2
APPLICATION NO. : 15/690374
DATED : February 25, 2020
INVENTOR(S) : Philip Robert LeBlanc et al.

It is certified that error appears in the above-identified patent and that said Letters Patent is hereby corrected as shown below:

In the Claims

In Column 12, Line 10 approx., Claim 17, delete "plurality color" and insert -- plurality of color --, therefor.

Signed and Sealed this
Fourth Day of October, 2022

Katherine Kelly Vidal
*Director of the United States Patent and Trademark Office*